(12) United States Patent
Dutta et al.

(10) Patent No.: US 12,324,358 B2
(45) Date of Patent: Jun. 3, 2025

(54) TALL BOTTOM ELECTRODE STRUCTURE IN EMBEDDED MAGNETORESISTIVE RANDOM-ACCESS MEMORY

(71) Applicant: International Business Machines Corporation, Armonk, NY (US)

(72) Inventors: Ashim Dutta, Clifton Park, NY (US); Lili Cheng, Rexford, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 536 days.

(21) Appl. No.: 17/539,316

(22) Filed: Dec. 1, 2021

(65) Prior Publication Data

US 2023/0172073 A1    Jun. 1, 2023

(51) Int. Cl.
*H10N 50/80*    (2023.01)
*H10B 61/00*    (2023.01)
*H10N 50/01*    (2023.01)

(52) U.S. Cl.
CPC ............. *H10N 50/80* (2023.02); *H10B 61/00* (2023.02); *H10N 50/01* (2023.02)

(58) Field of Classification Search
CPC ........ H10B 61/00; H10N 50/10; H10N 50/80; H10N 50/01
See application file for complete search history.

(56) References Cited

U.S. PATENT DOCUMENTS

| | | |
|---|---|---|
| 8,865,481 B2 | 10/2014 | Li |
| 9,203,013 B2 | 12/2015 | Li |
| 9,343,659 B1 | 5/2016 | Lu |
| 10,243,020 B1 * | 3/2019 | Clevenger ............ G11C 11/161 |
| 10,741,609 B2 | 8/2020 | Muthinti |
| 10,770,653 B1 * | 9/2020 | Penny .................... H10B 61/00 |
| 10,833,257 B1 | 11/2020 | Dutta |
| 10,957,738 B2 | 3/2021 | Hashemi |
| 2013/0119494 A1 | 5/2013 | Li |
| 2016/0365505 A1 | 12/2016 | Lu |
| 2018/0159023 A1 * | 6/2018 | Suh ....................... H10N 50/80 |
| 2020/0098982 A1 | 3/2020 | Chuang |

(Continued)

FOREIGN PATENT DOCUMENTS

| | | |
|---|---|---|
| CN | 109994602 A | 7/2019 |
| CN | 109545744 B | 8/2020 |

*Primary Examiner* — Chad M Dicke
*Assistant Examiner* — Jeremy Daniel Watts
(74) *Attorney, Agent, or Firm* — Edward J. Wixted, III (57) ABSTRACT

Embodiments of the invention include a method for fabricating a semiconductor device and the resulting structure. A substrate having an embedded memory area interconnect structure and an embedded non-memory area interconnect structure is provided, the memory area interconnect structure comprising metal interconnects formed in the substrate. A metal line on a metal interconnect of the non-memory area interconnect structure is formed. A first dielectric layer on exposed surfaces of the non-memory area is formed. A hardmask is formed on the dielectric layer. A second dielectric layer is formed on exposed surfaces of the memory area. A bottom metal contact is formed in a trench, a bottom surface of the bottom metal contact on a top surface of a first metal interconnect of the memory area interconnect structure. A memory element stack pillar is formed on the bottom metal contact.

12 Claims, 5 Drawing Sheets

(56) References Cited

U.S. PATENT DOCUMENTS

| | | | |
|---|---|---|---|
| 2021/0091301 A1* | 3/2021 | Arnold | H10N 70/841 |
| 2021/0098693 A1* | 4/2021 | Chuang | H10N 50/01 |
| 2021/0126051 A1 | 4/2021 | Dutta | |
| 2022/0045266 A1* | 2/2022 | Lin | H10N 50/80 |
| 2022/0359819 A1* | 11/2022 | Huang | H10N 50/10 |
| 2022/0376167 A1* | 11/2022 | Kuo | H10B 61/00 |

* cited by examiner

TALL BOTTOM ELECTRODE STRUCTURE IN EMBEDDED MAGNETORESISTIVE RANDOM-ACCESS MEMORY

BACKGROUND

The present invention relates generally to the field of magnetoresistive random-access memory (MRAM) devices and fabrication, and more particularly to the fabrication of a MRAM device and resulting structure that has a thick bi-layer cap dielectric and a tall bottom contact.

MRAM is a type of non-volatile random-access memory (RAM) which stores data in magnetic domains. Unlike conventional RAM technologies, data in MRAM is not stored as electric charge or current flows, but by magnetic storage elements formed from two ferromagnetic plates, each of which can hold a magnetization, separate by a thin insulating layer. One of the two plates is a permanent magnet set to a particular polarity. The other plate's magnetization can be changed to match that of an external field to store memory.

A magnetic tunnel junction (MTJ) includes two layers of magnetic metal separated by an ultrathin layer of insulator. The insulating layer is so thin that electrons can tunnel through the barrier if a bias voltage is applied between the two metal electrodes. MTJs are used in MRAM.

Back end of line (BEOL) is the portion of integrated circuit fabrication where the individual devices (transistors, capacitors, resisters, etc.) get interconnected with wiring on the wafer, the metallization layer. BEOL generally begins when the first layer of metal is deposited on the wafer. BEOL includes contacts, insulating layers (dielectrics), metal levels, and bonding sites for chip-to-package connections.

SUMMARY

Embodiments of the invention include a method for fabricating a semiconductor device and the resulting structure. The method can include providing a substrate having an embedded memory area interconnect structure and an embedded non-memory area interconnect structure, the memory area interconnect structure comprising metal interconnects formed in the substrate. The method can also include forming a metal line on a metal interconnect of the non-memory area interconnect structure. The method can also include forming a first dielectric layer on exposed surfaces of the non-memory area. The method can also include forming a hardmask on the dielectric layer. The method can also include forming a second dielectric layer on exposed surfaces of the memory area. The method can also include forming a bottom metal contact in a trench, a bottom surface of the bottom metal contact on a top surface of a first metal interconnect of the memory area interconnect structure. The method can also include forming a memory element stack pillar on the bottom metal contact.

DETAILED DESCRIPTION

Embodiments of the present invention recognize that, in embedded magnetoresistive random-access memory (MRAM) devices, significant gouging of the dielectric layer underneath the bottom electrode occurs during ion beam etching (IBE) of the magnetic tunnel junction (MTJ) stack. Such a process can remove significant dielectric cap material from the top of underlying metal lines in both the memory and logic areas of the MRAM device. Accordingly, the dielectric gouging increases the dielectric cap thickness and total height of the MRAM pillar, making it difficult to fit the whole pillar between two metal layers in advanced complementary metal-oxide-semiconductor (CMOS) technology nodes.

Embodiments of the present invention disclose a structure of an embedded MRAM device where the MRAM pillar, along with the bottom electrode contact height, is greater than the distance between the top and bottom of the metal layer. In such embodiments, each MRAM pillar is formed between two metal layers, ($M_x$ and $M_{x+1}$) by connecting the bottom electrode contact of the MRAM pillar to the metal layer below the metal layer $M_x$ (i.e., $M_{x-1}$). This allows embedding of MRAM pillars in between tighter inter-metal spacing. Embodiments of the present invention further describe a thin metal cap on top of a metal line in the memory area that does not include an MRAM pillar. Embodiments of the present invention further describe that the metal layer ($M_x$) in the logic area of the MRAM device is protected by sacrificial metal film formed by, for example, using blanket metal film deposition and block mask patterning. The sacrificial metal layer formed above the dielectric cap in the logic area absorbs IBE damage, protecting the interconnect level underneath. Such a sacrificial metal layer may have a thickness that can be adjusted based on the desired structure, and the thickness may be selected such that the sacrificial metal layer is completely removed during IBE processes. Further, MRAM area $M_x$ metal layer is protected from IBE damage by a sacrificial metal cap formed using, for example, selective deposition. Such a cap protects the interconnect layer in the MRAM area. Thickness of sacrificial metal capping layers on the MRAM area metal lines can be adjusted so as to leave some or no metal cap after IBE. Embodiments of the present invention recognize that in different embodiments, the thickness of the dielectric cap above $M_x$ metal lines in the logic and MRAM areas can be different, both in thickness and composition. As a result of the process described herein, the final thickness of the cap dielectric is independent of any gouging produced during IBE. Embodiments of the present invention further describe a bilayer dielectric cap that is flat in the logic area of the MRAM device and a single dielectric layer in the memory area of the MRAM device. Such an approach enables successful MRAM embedding in 14 nanometer (nm) and beyond, as intermetal spacing between $M_x$ and $M_{x+1}$ decreases.

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Turning now to an overview of technologies that are more specifically relevant to aspects of the invention, with the growth of digital data applications, there is a need for increasingly fast and scalable memory technologies for data storage and data-driven computation. Electronic memory can be classified as volatile or non-volatile. Volatile memory retains its stored data only when power is supplied to the memory, but non-volatile memory retains its stored data without constant power. Volatile RAM provides fast read/write speeds and easy re-write capability. However, when system power is switched off, any information not copied from volatile RAM to a hard drive is lost. Although non-volatile memory does not require constant power to retain its stored data, it in general has lower read/write speeds and a relatively limited lifetime in comparison to volatile memory.

MRAM is a non-volatile memory that combines a magnetic device with standard silicon-based microelectronics to achieve the combined attributes of non-volatility, high-speed read/write operations, high read/write endurance and data retention. The term "magnetoresistance" describes the effect whereby a change to certain magnetic states of the MTJ storage element (or "bit") results in a change to the MTJ resistance, hence the name "Magnetoresistive" RAM. A basic MTJ stack includes a free layer and a fixed/reference layer, each of which includes a magnetic material layer. The free and reference layers are separated by a non-magnetic insulating tunnel barrier. The free layer and the reference layer are magnetically de-coupled by the tunnel barrier. The free layer has a variable magnetization direction, and the reference layer has an invariable magnetization direction.

An MTJ stack stores information by switching the magnetization state of the free layer. When the free layer's magnetization direction is parallel to the reference layer's magnetization direction, the MTJ is in a low resistance state. Conversely, when the free layer's magnetization direction is anti-parallel to the reference layer's magnetization direction, the MTJ is in a high resistance state. The difference in resistance of the MTJ can be used to indicate a logical "1" or "0," thereby storing a bit of information. The tunneling magnetoresistance (TMR or MR) of an MTJ determines the difference in resistance between the high and low resistance states. A relatively high difference between the high and low resistance states facilitates read operations in the MRAM.

In embedded MRAM devices, fabrication operations (e.g., ion beam etching) used to form the MTJ stack can result in significant gouging of the dielectric regions that are underneath the bottom electrode of the MTJ. This can result in the removal of most or all of the dielectric cap layer in both memory and logic areas in the MRAM device, thus exposing copper lines of the interconnect (or metallization) layer below.

The present invention will now be described in detail with reference to the Figures.

Figure 1:
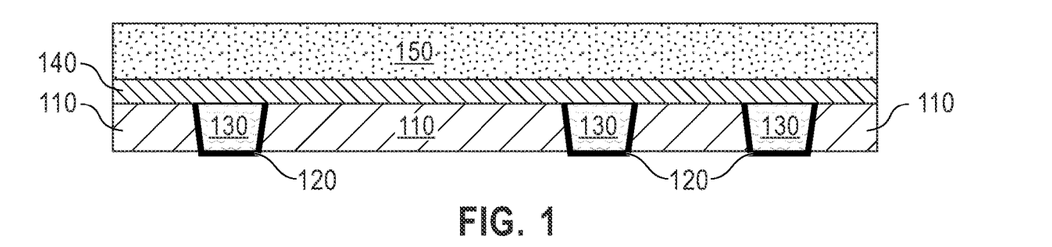
FIG. 1 depicts a semiconductor structure after an initial set of processing operations, in accordance with an embodiment of the invention.

FIG. 1 depicts a cross-sectional view of a device at an early stage in the method of forming the device and after an initial set of fabrication operations according to one embodiment of the invention. FIG. 1 shows the formation of dielectric layer 140 and dielectric layer 150 on exposed top surfaces of metal lines 130 (which comprise metal layer $M_{x-1}$), barrier layer 120, and substrate 110.

The depicted structure includes a logic area and a memory area that are referenced herein. The logic area comprises the left half of the depicted device and the memory area comprises the right half of the depicted device.

In some embodiments of the invention, the substrate 110 can include various middle of line (MOL) and front end of line (FEOL) structures. FEOL structures can include structures such as wells, source/drain (S/D) regions, extension junctions, silicide regions, liners, and the like. The MOL structures can include contacts and other structures that couple to the active regions (e.g., gate/source/drain) of the FEOL structures in the substrate 110. Networks of metal lines 130 (e.g., conductive lines, conductive wires, barrier layers, and the like) have been formed in substrate 110 as part of the BEOL structures formed during initial portions of the BEOL stage.

Substrate 110 is an interlayer dielectric. Substrate 110 serves as an isolation structure for the lines and vias of the structure. Substrate 110 can be made of any suitable dielectric material, such as, for example, low-K dielectrics (i.e., materials having a small dielectric constant relative to silicon dioxide, i.e., less than about 3.9), ultra-low-K dielectrics (i.e., materials having a dielectric constant less than 3), tetraethyl orthosilicate (TEOS), porous silicates, carbon doped oxides, silicon dioxides, silicon nitrides, silicon oxynitrides, silicon carbide (SiC), or other dielectric materials. Any known manner of forming substrate 110 can be utilized, such as, for example, chemical vapor deposition (CVD), plasma-enhanced chemical vapor deposition (PECVD), atomic layer deposition (ALD), flowable CVD, spin-on dielectrics, or physical vapor deposition (PVD).

The interconnect structure (an "$M_{x-1}$" layer) in accordance with aspects of the invention can be fabricated by patterning metal lines in a trench using lithography and an etch.

In some embodiments of the invention, metal lines 130 include a conductive material formed or deposited in a trench of a metallization layer using known BEOL processes. In some embodiments of the invention, metal lines 130 are overfilled above a surface of the trench (not shown), forming overfill that can be removed using, for example, a chemical-mechanical planarization (CMP) process. Metal lines 130 can be made of any suitable conducting material, such as, for example, metal (e.g., tungsten (W), titanium (Ti), tantalum (Ta), Ru, zirconium (Zr), Co, Cu, aluminum (Al), platinum (Pt)), alloys thereof (e.g., AlCu, CuMn, CuTi), conducting metallic compound material (e.g., tantalum nitride, TiN, tantalum carbide, titanium carbide, titanium aluminum carbide, tungsten silicide, tungsten nitride, cobalt silicide, nickel silicide), conductive carbon, or any suitable combination of such materials. In some embodiments of the invention, metal lines 130 are copper lines (copper interconnect). Metal lines 130 can be formed or deposited using, for example, CVD, PECVD, PVD, sputtering, plating, chemical solution deposition, and electroless plating. Metal lines 130 can further include a barrier layer 120 between the metal fill of the metal lines 130 and the substrate 110.

In some embodiments of the invention, barrier layer 120 can be formed between metal lines 130 and substrate 110. Barrier layer 120 can serve as a diffusion barrier, preventing the copper (or other metal) from diffusing into, or doping, the surrounding dielectric materials, which can degrade the surrounding dielectric material properties. Silicon, for example, forms deep-level traps when doped with copper. Barrier layer 120 can be titanium (Ti), titanium nitride (TiN), tantalum (Ta), tantalum nitride (TaN), ruthenium (Ru), tungsten (W), tungsten nitride (WN), tungsten carbon nitride (WCN), combinations thereof, or another high melting point metal or conductive metal nitride where the barrier layer 120 can prevent diffusion and/or alloying of the metal contact fill material (used to form the metal lines 130) with a top source/drain material, and/or anode/cathode material. In embodiments of the invention, the barrier layer 120 can be deposited by ALD, PVD, CVD, metalorganic chemical vapor deposition (MOCVD), PECVD, or combinations thereof.

Dielectric layer 140 is formed over the substrate 110 and exposed portions of metal lines 130 and barrier layer 120. Dielectric layer 140 can be any suitable dielectric material such as, for example, SiN, SiCN(H), TEOS, SiO, or other oxide materials. Dielectric layer 140 can be deposited using CVD, PECVD, PVD, or other deposition processes.

Dielectric layer 150 is formed over dielectric layer 140. Dielectric layer 150 can be any suitable insulating material such as, for example, silicon dioxide, silicon nitride, nitrogen doped silicon carbide (SiC), TEOS, and the like. In some embodiments, dielectric layer 150 is an ultra-low-K dielectric (i.e., a material having a dielectric constant less than 3). Dielectric layer 150 can be deposited using CVD, PECVD, PVD, or other deposition processes.

Figure 2:
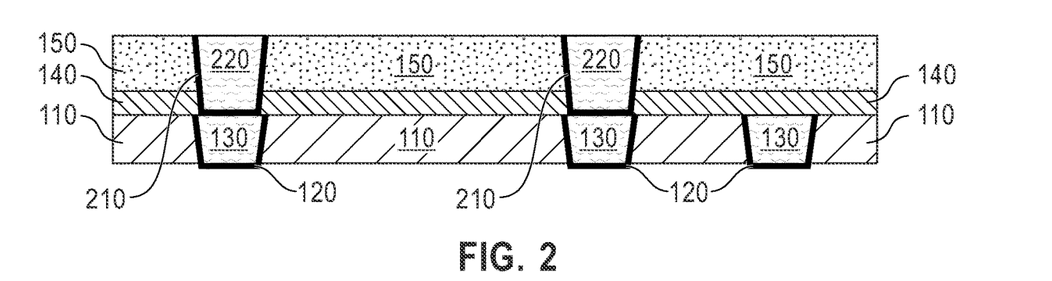
FIG. 2 depicts a process of forming metal lines and a barrier layer, in accordance with an embodiment of the invention.

FIG. 2 depicts a cross-sectional view of fabrication steps, in accordance with an embodiment of the present invention. FIG. 2 shows the formation of metal lines 220 and barrier layer 210.

Trenches may be formed by an etching process, such as reactive-ion etching (RIE), laser ablation, or any etch process which can be used to selectively remove a portion of material such as dielectric layer 150 and dielectric layer 140. A hardmask (not shown) may be patterned using photoresist to expose areas of dielectric layer 150 and dielectric layer 140 where trenches are desired and the hardmask may be utilized during the etching process in the creation of the trenches. The etching process only removes portions of dielectric layer 150 and dielectric layer 140 not protected by the hardmask and the etching process stops at metal lines 130.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown) is removed. The process of removing the photoresist is similar to that of the process of removing the hardmask.

In some embodiments of the invention, metal lines 220 include a conductive material formed or deposited in a trench of a metallization layer using known BEOL processes. In some embodiments of the invention, metal lines 220 are overfilled above a surface of the trench (not shown), forming overfill that can be removed using, for example, a CMP process. Metal lines 220 can be made of any suitable conducting material, such as, for example, metal (e.g., W, Ti, Ta, Ru, Zr, Co, Cu, Al, Pt), alloys thereof (e.g., AlCu, CuMn, CuTi), conducting metallic compound material (e.g., tantalum nitride, TiN, tantalum carbide, titanium carbide, titanium aluminum carbide, tungsten silicide, tungsten nitride, cobalt silicide, nickel silicide), conductive carbon, or any suitable combination of such materials. In some embodiments of the invention, metal lines 220 are copper lines (copper interconnect). Metal lines 220 can be formed or deposited using, for example, CVD, PECVD, PVD, sputtering, plating, chemical solution deposition, and electroless plating. Metal lines 220 can further include a barrier layer 210 between the metal fill of the metal lines 220 and the surfaces of the formed trenches.

In some embodiments of the invention, barrier layer 210 can be formed between metal lines 220 and the surfaces of the formed trenches. Barrier layer 210 can serve as a diffusion barrier, preventing the copper (or other metal) from diffusing into, or doping, the surrounding dielectric materials, which can degrade the surrounding dielectric material properties. Silicon, for example, forms deep-level traps when doped with copper. Barrier layer 210 can be Ti, TiN, Ta, TaN, Ru, W, WN, WCN, combinations thereof, or another high melting point metal or conductive metal nitride where the barrier layer 210 can prevent diffusion and/or alloying of the metal contact fill material (used to form the metal lines 220) with a top source/drain material, and/or anode/cathode material. In embodiments of the invention, the barrier layer 210 can be deposited by ALD, PVD, CVD, MOCVD, PECVD, or combinations thereof.

Figure 3:
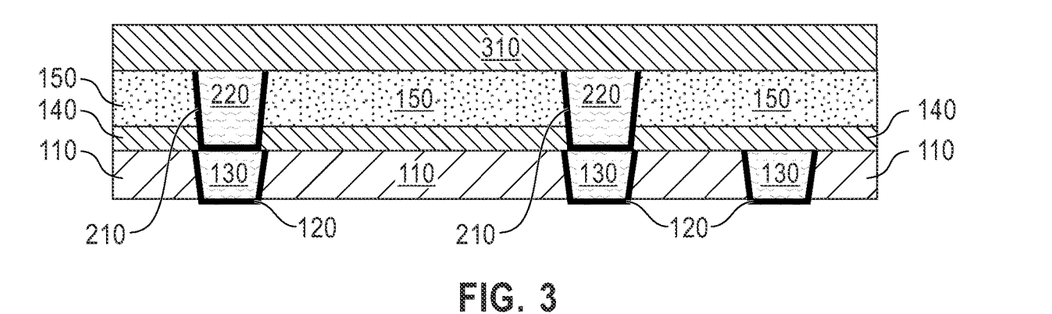
FIG. 3 depicts a process of forming a dielectric layer, in accordance with an embodiment of the invention.

FIG. 3 depicts a cross-sectional view of fabrication steps, in accordance with an embodiment of the present invention. FIG. 3 shows the formation of dielectric layer 310.

Dielectric layer 310 is formed over dielectric layer 150 and exposed portions of metal lines 220 and barrier layer 210. Dielectric layer 310 can be any suitable dielectric material such as, for example, SiN, SiCN(H), TEOS, SiO, or other oxide materials. Dielectric layer 310 can be deposited using CVD, PECVD, PVD, or other deposition processes.

Figure 4:
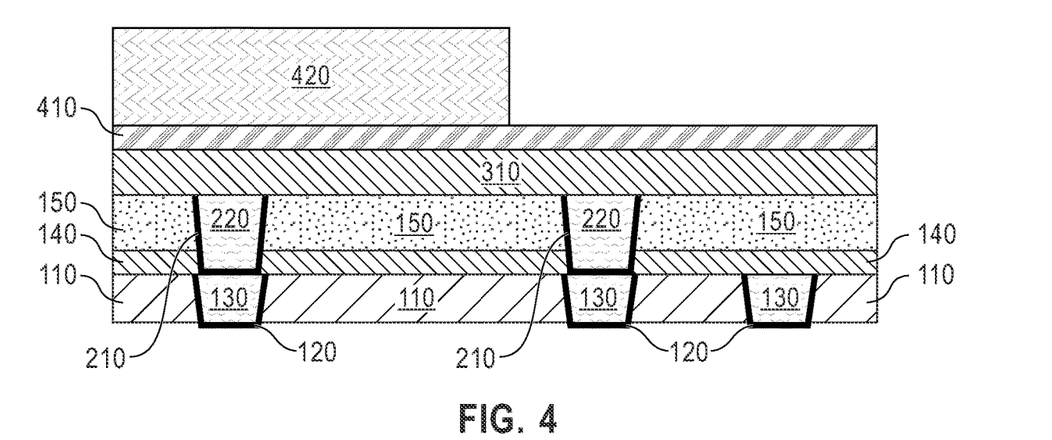
FIG. 4 depicts a process of forming a hardmask and photoresist, in accordance with an embodiment of the invention.

FIG. 4 depicts a cross-sectional view of fabrication steps, in accordance with an embodiment of the present invention. FIG. 4 shows the formation of hardmask 410 and photoresist 420.

Hardmask 410 is deposited on top of dielectric layer 310. A hardmask is a material used in semiconductor processing as an etch mask. Hardmask 410 is composed of metal or a dielectric material such as, for example, a low-K dielectric, a nitride, silicon nitride, silicon oxide, SiON, SiC, SiOCN, or SiBCN. In some embodiments of the invention, hardmask 410 is a silicon nitride or silicon oxide hardmask. In some embodiments, hardmask 410 is TaN or TiN. Hardmask 410 may be deposited using, for example, any suitable process, such as CVD, PECVD, ultrahigh vacuum chemical vapor deposition (UHVCVD), rapid thermal chemical vapor deposition (RTCVD), MOCVD, low-pressure chemical vapor deposition (LPCVD), limited reaction processing CVD (LRPCVD), ALD, flowable CVD, spin-on dielectrics, PVD, molecular beam epitaxy (MBE), chemical solution deposition, spin-on dielectrics, or other like process.

Photoresist 420 is deposited on top of hardmask 410. A photoresist is a light-sensitive material used in processes, such as photolithography, to form a patterned coating on a surface. Photoresist 420 may be a light-sensitive polymer that acts as a lithography mask. In various embodiments, standard photolithographic processes are used to define a pattern of hardmask 410 in a layer of photoresist 420 deposited on hardmask 410. The desired hardmask pattern may then be formed in hardmask 410 by removing hardmask 410 from the areas not protected by the pattern in the photoresist 420 layer. Hardmask 410 is removed using, for example, reactive ion etching (RIE). RIE uses chemically reactive plasma, generated by an electromagnetic field, to remove various materials. A person of ordinary skill in the art will recognize that the type of plasma used will depend on the material of which hardmask 410 is composed, or that other etch processes such as wet chemical etching or laser ablation may be used.

Figure 5:
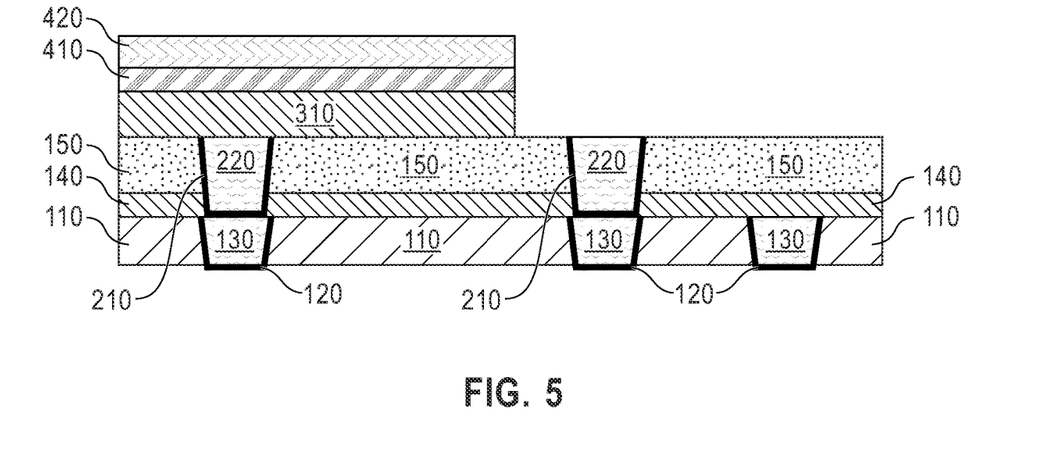
FIG. 5 depicts a process of patterning a hardmask and removing portions of a dielectric layer not protected by the hardmask, in accordance with an embodiment of the invention.

FIG. 5 depicts a cross-sectional view of fabrication steps, in accordance with an embodiment of the present invention. FIG. 5 shows the patterning of hardmask 410 and the removal of portions of dielectric layer 310 not protected by hardmask 410.

As described above, with reference to FIG. 4, hardmask 410 and photoresist 420 may be patterned utilizing photolithographic processes and the hardmask pattern shown in FIG. 5 may be formed by removing hardmask 410 from the areas not protected by the pattern in photoresist 420 using, for example, RIE.

Hardmask 410 may be patterned such that hardmask 410 exposes the memory area of the device.

Portions of dielectric layer 310 that are not protected by hardmask 410 may be removed by an etching process, such as RIE, laser ablation, or any etch process which can be used to selectively remove a portion of material such as dielectric layer 310. Hardmask 410 may be utilized during the etching process to protect portions of dielectric layer 310 that are located in the logic area of the device. The etching process only removes the portions of dielectric layer 310 not protected by hardmask 410 and the etching process stops upon exposing top surfaces of dielectric layer 150, metal lines 220, and barrier layer 210.

Figure 6:
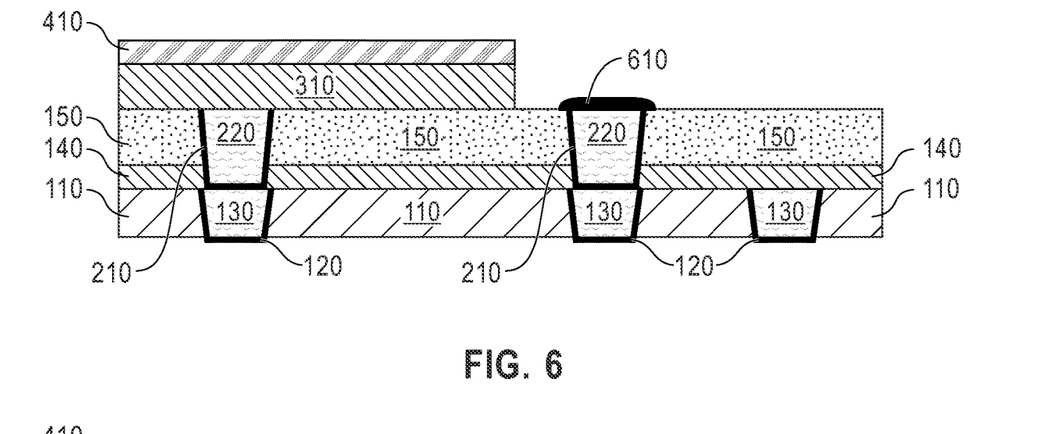
FIG. 6 depicts a process of removing a photoresist and forming a metal cap, in accordance with an embodiment of the invention.

FIG. 6 depicts a cross-sectional view of fabrication steps, in accordance with an embodiment of the present invention. FIG. 6 shows the removal of photoresist 420 and the formation of metal cap 610.

Photoresist 420 is removed. In general, the process of removing photoresist 420 involves the use of an etching process, such as RIE, laser ablation, or any etch process which can be used to selectively remove a portion of material, such as photoresist 420.

Metal cap 610 is formed on, at least, exposed metal lines 220. In some embodiments, metal cap 610 formation extends to exposed portions of barrier layer 210 and portions of dielectric layer 150 that are near the exposed metal lines 220. Metal cap 610 may be composed of Ti, TiN, Ta, TaN, Ru, Co, HfN, Nb, NbN, W, WN, WCN, Mo, Cr, V, Pd, Pt, Rh, Sc, Al, combinations thereof, or another high melting point metal or conductive metal nitride. Metal cap 610 may be formed by a selective metal growth technique.

Selective metal growth techniques include bottom-up formation through selective metal growth. In some embodiments, metal cap 610 is grown via selective metal growth such that deposition and etching is not required. A work function metal, acting as a seeding layer may be utilized such that the metal cap 610 metal cannot grow without, such that the metal cap 610 grows only on the surfaces of the work function metal. The work function metal may be, for example, Cu, TaN, TiN, titanium aluminum carbine (TiAlC), or TiC.

Figure 7:
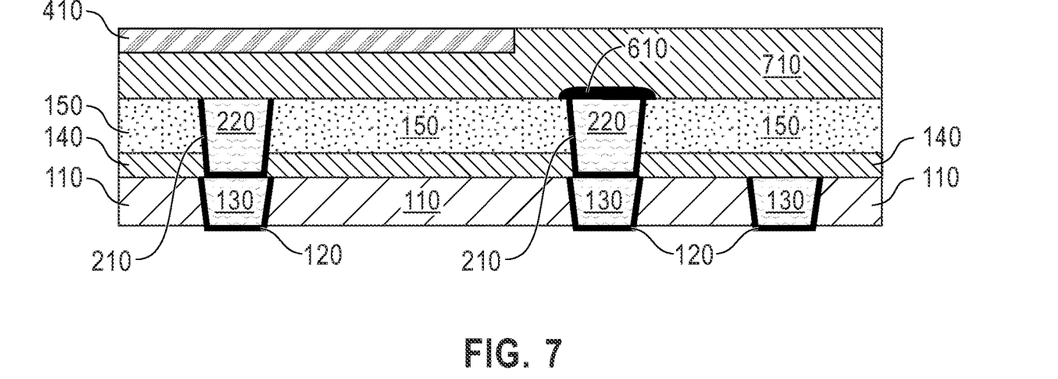
FIG. 7 depicts a process of forming additional dielectric material on a memory area side, in accordance with an embodiment of the invention.

FIG. 7 depicts a cross-sectional view of fabrication steps, in accordance with an embodiment of the present invention. FIG. 7 shows the formation of additional dielectric material on the memory area side of the device that, in combination with the already existing dielectric layer 310, results in the formation of dielectric layer 710.

Dielectric material is formed over hardmask 410 and exposed portions of dielectric layer 150 and metal cap 610. The dielectric material may be any suitable dielectric material such as, for example, SiN, SiCN(H), TEOS, SiO, or other oxide materials. In some embodiments, the dielectric material is the same material as the material that comprises dielectric layer 310. The dielectric material can be deposited using CVD, PECVD, PVD, or other deposition processes. Subsequent to the deposition of the dielectric material, dielectric layer 710 may be overfilled above the top surface of hardmask 410, forming an overfill that can be removed using, for example, a CMP process, to expose a top surface of hardmask 410.

Figure 8:
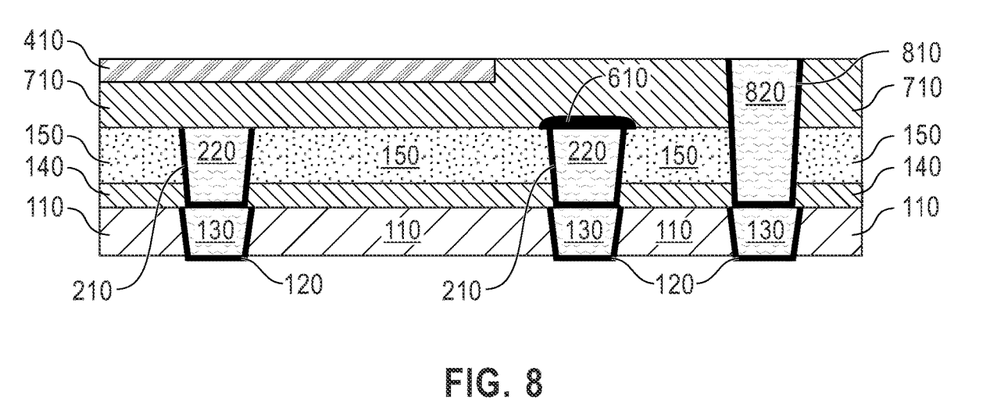
FIG. 8 depicts a process of forming a metal contact and barrier layer in a memory area, in accordance with an embodiment of the invention.

FIG. 8 depicts a cross-sectional view of fabrication steps, in accordance with an embodiment of the present invention. FIG. 8 shows the formation of metal contact 820 and barrier layer 810 in the memory area of the device.

Metal contact 820 acts as the bottom electrode contact for the MRAM device.

A trench may be formed by an etching process, such as RIE laser ablation, or any etch process which can be used to selectively remove a portion of material such as dielectric layer 710, dielectric layer 150, and dielectric layer 140. A hardmask (not shown) may be patterned using photoresist to expose areas of dielectric layer 710, dielectric layer 150, and dielectric layer 140 where trenches are desired and the hardmask may be utilized during the etching process in the creation of the trenches. The etching process only removes portions of dielectric layer 710, dielectric layer 150, and dielectric layer 140 not protected by the hardmask and the etching process stops at metal lines 130.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown) is removed. The process of removing the photoresist is similar to that of the process of removing the hardmask.

In some embodiments of the invention, metal contact 820 includes a conductive material formed or deposited in a trench of a metallization layer using known BEOL processes. In some embodiments of the invention, metal contact 820 is overfilled above a surface of the trench (not shown), forming overfill that can be removed using, for example, a CMP process. Metal contact 820 can be made of any suitable conducting material, such as, for example, metal (e.g., W, Ti, Ta, Ru, Zr, Co, Cu, Al, Pt), alloys thereof (e.g., AlCu, CuMn, CuTi), conducting metallic compound material (e.g., tantalum nitride, TiN, tantalum carbide, titanium carbide, titanium aluminum carbide, tungsten silicide, tungsten nitride, cobalt silicide, nickel silicide), conductive carbon, or any suitable combination of such materials. Metal contact 820 can be formed or deposited using, for example, CVD, PECVD, PVD, sputtering, plating, chemical solution deposition, and electroless plating. Metal contact 820 can further include a barrier layer 810 between the metal fill of metal contact 820 and the surfaces of the formed trenches.

In some embodiments of the invention, barrier layer 810 can be formed between metal contact 820 and the surfaces of the formed trenches. Barrier layer 810 can serve as a diffusion barrier, preventing the copper (or other metal) from diffusing into, or doping, the surrounding dielectric materials, which can degrade the surrounding dielectric material properties. Silicon, for example, forms deep-level traps when doped with copper. Barrier layer 810 can be Ti, TiN, Ta, TaN, Ru, W, WN, WCN, combinations thereof, or another high melting point metal or conductive metal nitride where the barrier layer 810 can prevent diffusion and/or alloying of the metal contact fill material (used to form metal contact 820) with a top source/drain material, and/or anode/cathode material. In embodiments of the invention, barrier layer 810 can be deposited by ALD, PVD, CVD, MOCVD, PECVD, or combinations thereof.

Figure 9:
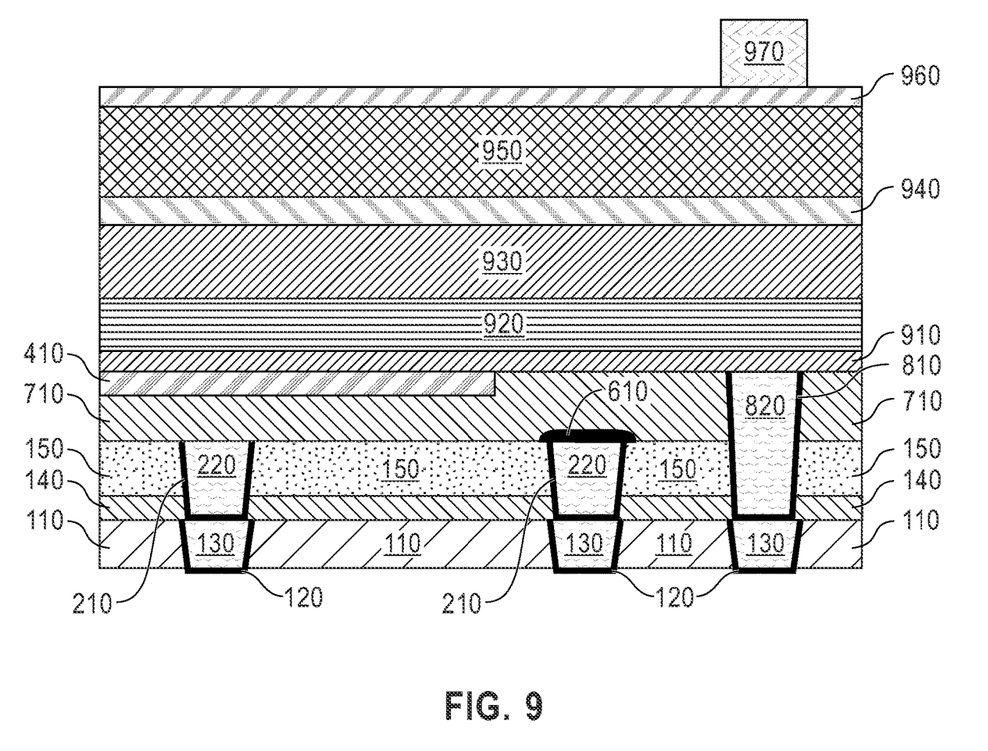
FIG. 9 depicts a process of forming a magnetoresistive random-access memory (MRAM) stack and hardmask and patterning a photoresist, in accordance with an embodiment of the invention.

FIG. 9 depicts a cross-sectional view of fabrication steps, in accordance with an embodiment of the present invention. FIG. 9 shows the formation of the MRAM stack and hardmask and patterning of photoresist 970.

Bottom electrode layer 910 is formed over exposed surfaces of hardmask 410, dielectric layer 710, barrier layer 810, and metal contact 820. Bottom electrode layer 910 is deposited using any suitable means such as, for example, PVD, CVD, or ALD. Bottom electrode layer 910 may be Ti, TiN, Ta, TaN, Ru, HfN, Nb, NbN, W, WN, WCN, Mo, Cr, V, Pd, Pt, Rh, Sc, Al, combinations thereof, or another high melting point metal or conductive metal nitride.

Known fabrication techniques are utilized to form an MRAM stack according to one or more embodiments. The MRAM stack can be formed by depositing MTJ stack 920, a top electrode layer 930, hardmask 940, along with a tri-level mask (organic planarization layer (OPL) 950, anti-reflection coating (ARC) layer 960, and photoresist 970) where the photoresist 970 covers the MRAM stack at a desired location for an MRAM pillar.

MTJ stack 920 includes a free layer and a fixed/reference layer, each of which includes a magnetic material. The free and reference layers are separated by a non-magnetic insulating tunnel barrier. The free layer and the reference layer are magnetically de-coupled by the tunnel barrier. The free layer has a variable magnetization direction, and the reference layer has an invariable magnetization direction. A wide variety of layers and elements (e.g., an MTJ cap, multiple free/reference layers) can be included in MTJ stack 920. MTJ stack 920 is deposited over bottom electrode layer 910 using known fabrication operations.

Top electrode layer 930 is formed over MTJ stack 920. Top electrode layer 930 is deposited using any suitable means such as, for example, CVD or ALD. Top electrode layer 930 may be Ti, TiN, Ta, TaN, Ru, HfN, Nb, NbN, W, WN, WCN, Mo, Cr, V, Pd, Pt, Rh, Sc, Al, combinations thereof, or another high melting point metal or conductive metal nitride.

Hardmask 940 is formed over top electrode layer 930. Hardmask 940 is deposited using any suitable means such as, for example, CVD or ALD. Hardmask 940 can be made of any suitable dielectric material, such as, for example, low-K dielectrics (i.e., materials having a small dielectric constant relative to silicon dioxide, i.e., less than about 3.9), ultra-low-K dielectrics (i.e., materials having a dielectric constant less than 3), TEOS, porous silicates, carbon doped oxides, silicon dioxides, silicon nitrides, silicon oxynitrides, SiC, or other dielectric materials.

OPL 950 is formed on hardmask 940. OPL 950 can be spun on and baked, or can be deposited by CVD. OPL 950 may be, for example, a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, OPL 950 can include a transparent organic polymer.

ARC layer 960 is formed on OPL 950. ARC layer 960 is deposited using any suitable means such as, for example, CVD or ALD. ARC layer 960 can include SiARC, although other ARC layer materials can be employed.

Photoresist 970 is deposited on top of ARC layer 960. Photoresist 970 may be a light-sensitive polymer that acts as a lithography mask. In various embodiments, standard photolithographic processes are used to define a pattern of ARC layer 960 in a layer of photoresist 970 deposited on ARC layer 960. The desired pattern may then be formed by removing ARC layer 960, OPL 950, and hardmask 940 from the areas not protected by the pattern in the photoresist 420 layer. ARC layer 960, OPL 950, and hardmask 940 are removed using, for example, RIE. RIE uses chemically reactive plasma, generated by an electromagnetic field, to remove various materials. A person of ordinary skill in the art will recognize that the type of plasma used will depend on the material of which ARC layer 960, OPL 950, and hardmask 940 are composed, or that other etch processes such as wet chemical etching or laser ablation may be used.

Figure 10:
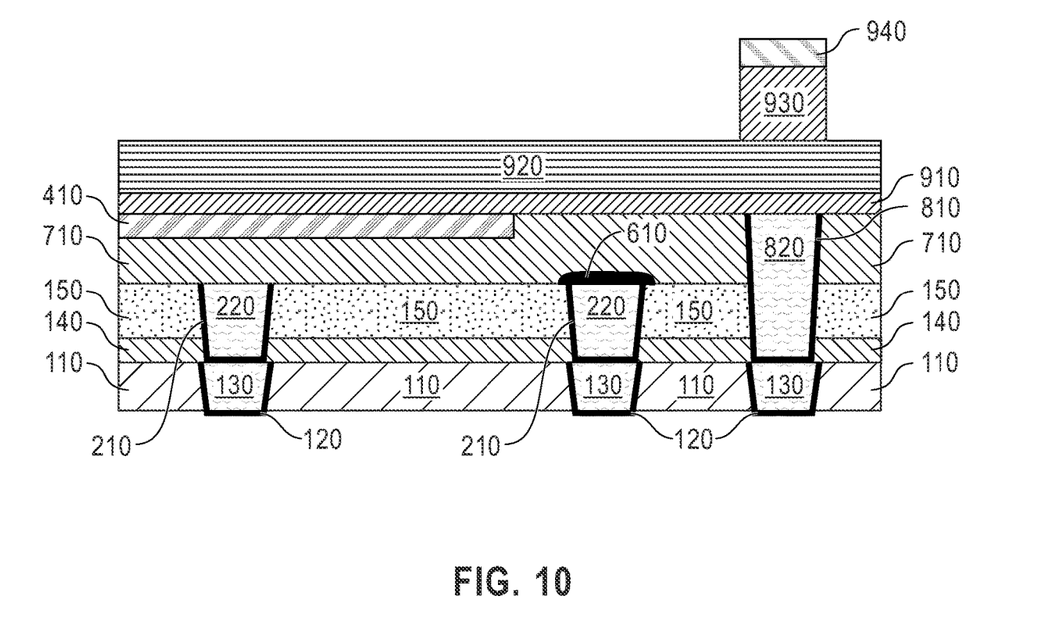
FIG. 10 depicts a process of removing portions of a hardmask and a top electrode layer that are not protected by a photoresist and the subsequent removal of the photoresist and remaining portions of organic planarization layer (OPL) and antireflection coating (ARC) layer, in accordance with an embodiment of the invention.

FIG. 10 depicts a cross-sectional view of fabrication steps, in accordance with an embodiment of the present invention. FIG. 10 shows the removal of portions of hardmask 940 and top electrode layer 930 not protected by photoresist 970 and subsequent removal of photoresist 970 and remaining portions of OPL 950 and ARC layer 960.

Photoresist 970 is patterned using lithography to form pillars which are then transferred to top electrode layer 930 using RIE. The process of removing photoresist 970 and remaining portions of OPL 950 and ARC layer 960 generally involves the use of an etching process such as RIE, laser ablation, or any etch process which can be used to selectively remove a portion of material such as photoresist 970, OPL 950, and/or ARC layer 960.

Figure 11:
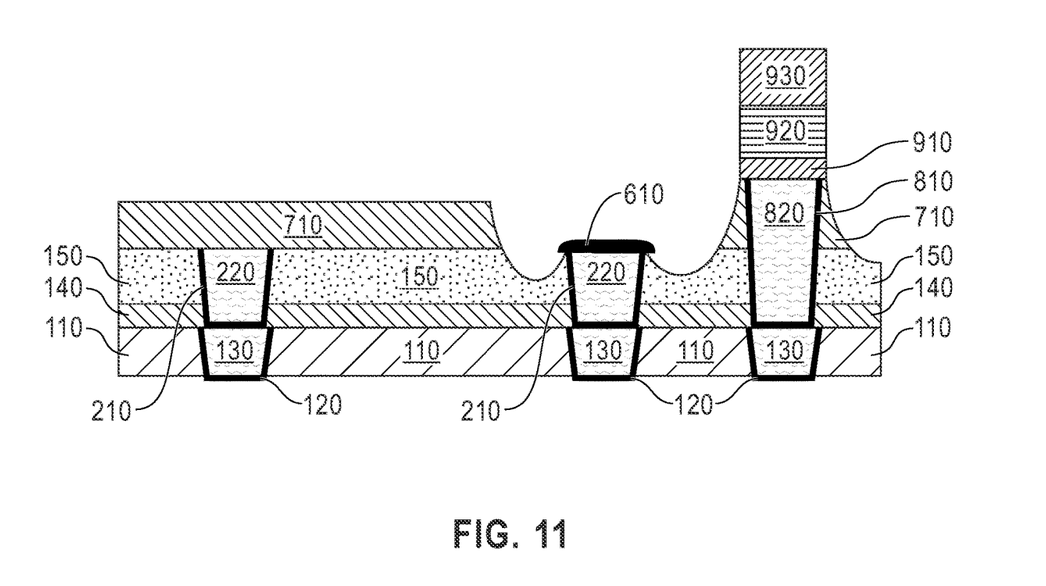
FIG. 11 depicts a process of forming MRAM pillars, in accordance with an embodiment of the invention.

FIG. 11 depicts a cross-sectional view of fabrication steps, in accordance with an embodiment of the present invention. FIG. 11 shows the formation of MRAM pillars.

In some embodiments, the pillar pattern is transferred from top electrode layer 930 to MTJ stack 920 and bottom electrode layer 910 using an etching operations such as, for example, IBE. A portion of the dielectric layer 710 remains after the IBE protecting metal contact 820 in the memory area and interconnect structures in the logic area from IBE gouging. Further, metal cap 610 protects the metal line 220 located in the memory area from IBE gouging. In one or more embodiments, the critical dimension of metal contact 820 is smaller (i.e. has a narrower width) than that of bottom electrode layer 910 and/or MTJ stack 920 to prevent exposure of metal contact 820 during MTJ pillar patterning using IBE. This eliminates the possibility of any additional metal sputtering and redeposition on MTJ pillars after etching bottom electrode layer 910 and reduces risk of tunnel junction shorts.

Figure 12:
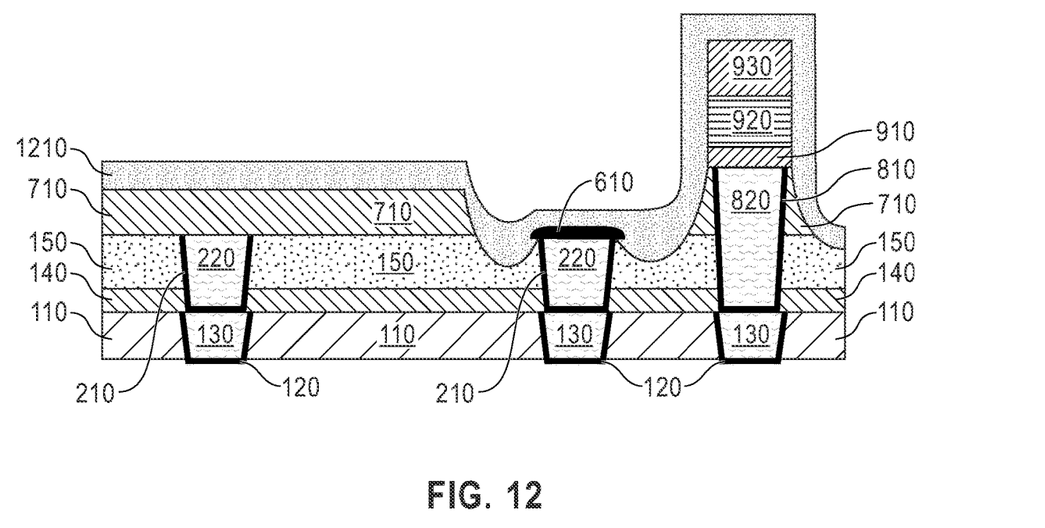
FIG. 12 depicts a process of forming a pillar encapsulation layer, in accordance with an embodiment of the invention.

FIG. 12 depicts a cross-sectional view of fabrication steps, in accordance with an embodiment of the present invention. FIG. 12 shows the formation of pillar encapsulation layer 1210.

Pillar encapsulation layer 1210 can be conformally deposited over exposed portions of the device using any known deposition process such as, for example, CVD or ALD. Pillar encapsulation layer 1210 can be any suitable dielectric material including, but not limited to, SiN, SiCN(H), TEOS, or other oxides.

Figure 13:
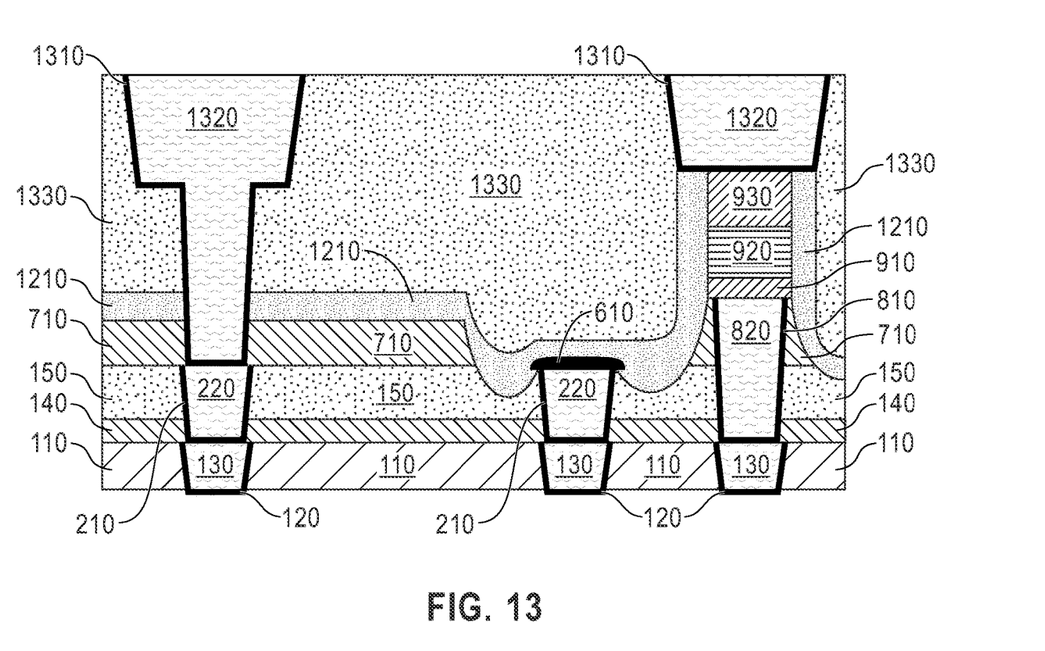
FIG. 13 depicts a process of forming an interlayer dielectric (ILD) layer, contacts, and a barrier layer, in accordance with an embodiment of the invention.

FIG. 13 depicts a cross-sectional view of fabrication steps, in accordance with an embodiment of the present invention. FIG. 13 shows the formation of interlayer dielectric (ILD) layer 1330, contacts 1320, and barrier layer 1310.

Known fabrication techniques are utilized to form contacts 1320 in the memory region and logic region, according to one or more embodiments of the invention. ILD layer 1330 can be deposited over the exposed portions of the device. ILD layer 1330 may be any type of interlayer dielectric material including, for example, low-K dielectrics (i.e., materials having a small dielectric constant relatively to silicon dioxide, i.e., less than about 3.9), ultra-low-K dielectrics (i.e., materials having a dielectric constant less than 3), TEOS, porous silicates, carbon doped oxides, silicon dioxides, silicon nitrides, silicon oxynitrides, SiC, or other dielectric materials. Trenches and vias can be formed in the ILD layer 1330, pillar encapsulation layer 1210, and dielectric layer 710 to expose portions of the top electrode layer 930 in the memory area and portions of the interconnect structures in the logic area (e.g., metal lines 220).

A barrier layer 1310 can be formed in the trenches and vias followed by deposition of contacts 1320. Barrier layer 1310 can be Ti, TiN, Ta, TaN, Ru, W, WN, WCN, combinations thereof, or another high melting point metal or conductive metal nitride. In embodiments of the invention, the barrier layer 1310 can be deposited by ALD, PVD, CVD, MOCVD, PECVD, or combinations thereof.

Contacts 1320 can be made of any suitable conducting material, such as, for example, metal (e.g., W, Ti, Ta, Ru, Zr, Co, Cu, Al, Pt), alloys thereof (e.g., AlCu, CuMn, CuTi), conducting metallic compound material (e.g., tantalum nitride, TiN, tantalum carbide, titanium carbide, titanium aluminum carbide, tungsten silicide, tungsten nitride, cobalt silicide, nickel silicide), conductive carbon, or any suitable combination of such materials. A resist, such as a photoresist along with tri-layer lithographic stack, can be deposited and patterned to form the trenches for the metal lines and contacts 1320. In some embodiments of the invention, contacts 1320 are overfilled above a surface of the trench (not shown), forming overfill that can be removed using, for example, a CMP process. The height of the MRAM pillar, along with the bottom electrode contact height, is larger than the height of the contact for the interconnect structures in the logic region. This allows fitting a taller MRAM pillar in the memory region without increasing the contact height in the logic region since increase in height increases the challenge of etching and filling contacts in logic area due to increase in contact aspect ratio.

The resulting structure includes a memory area that includes an MRAM device with a tall bottom contact that is able to extend through the $M_x$ layer which allows for MRAM embedding between tighter intermetal spacing. Further, a metal line in the memory area is protected with a thin metal cap. In addition, the thickness of the dielectric above the $M_x$ metal lines in both the logic and memory areas can be different in both thickness and material composition. Further, the bi-layer dielectric in the logic area is flat, and the bi-layer dielectric in the memory area is not flat. Such a structure results in increased protection to the $M_x$ metal lines when forming MRAM pillars and can enable successful MRAM embedding in 14 nm and beyond technologies.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    an embedded memory area interconnect structure and an embedded non-memory area interconnect structure, the memory area interconnect structure comprising metal interconnects formed in a substrate;
    a first top contact on a metal interconnect of the non-memory area interconnect structure;
    a bottom metal contact in a trench of dielectric material on a first metal interconnect of the memory area interconnect structure, a bottom surface of the bottom metal contact lower than a bottom surface of the first top contact;
    a memory element stack pillar on the bottom metal contact;
    a pillar encapsulation layer present on sidewalls of the memory element stack pillar, wherein:
        the pillar encapsulation layer comprises a dielectric material; and
        a bottom surface of the pillar encapsulation layer of the non-memory area interconnect structure is higher than a bottom surface of the pillar encapsulation layer of the memory area interconnect structure; and
    a metal cap directly contacting a top surface of a second metal interconnect of the memory area interconnect structure, wherein:
        the top surface of the metal cap is lower than a top surface of the bottom metal contact; and
        the top surface of the metal cap directly contacts the bottom surface of the pillar encapsulation layer of the memory area interconnect structure.

2. The semiconductor structure of claim 1, further comprising multiple layers of dielectric material on a sidewall of the first top contact.

3. The semiconductor structure of claim 1, wherein the memory element stack pillar comprises a magnetic tunnel junction (MTJ) stack.

4. The semiconductor structure of claim 1, wherein a width of the metal cap is greater than a combined width of: (i) the second metal contact interconnect of the memory area interconnect structure and (ii) a barrier layer present on sidewalls of the second metal interconnect of the memory area interconnect structure.

5. The semiconductor structure of claim 1, further comprising a barrier layer present on each sidewall and bottom surface of: the metal interconnect of the non-memory area interconnect structure, the bottom metal contact, the first metal interconnect of the memory area interconnect structure, and the first top contact.

6. The semiconductor structure of claim 5, wherein the barrier layer is of a material selected from the group consisting of: WN and WCN.

7. The semiconductor structure of claim 1, further comprising a second top contact over the memory element stack pillar.

8. The semiconductor structure of claim 7, wherein a first distance between a top surface of the first top contact and the non-memory area interconnect structure is less than a second distance between a top surface of the second top contact and the memory area interconnect structure.

9. The semiconductor structure of claim 1, wherein a width of the bottom metal contact is less than a width of the memory element stack pillar.

10. The semiconductor structure of claim 1, further comprising an interlayer dielectric layer on exposed surfaces of the pillar encapsulation layer and sidewalls of the first top contact and a second top contact, the second top contact over the metal interconnect of the non-memory area interconnect structure, wherein the interlayer dielectric layer separates sidewalls of the first top contact and the second top contact.

11. The semiconductor structure of claim 3, further comprising a top electrode on the MTJ stack.

12. The semiconductor structure of claim 3, further comprising a bottom electrode between the MTJ stack and the bottom metal contact.

* * * * *